United States Patent
Lifka et al.

(10) Patent No.: US 8,563,967 B2
(45) Date of Patent: Oct. 22, 2013

(54) ORGANIC FUNCTIONAL DEVICE AND MANUFACTURING METHOD THEREFOR

(75) Inventors: Herbert Lifka, Eindhoven (NL); Cristina Tanase, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 557 days.

(21) Appl. No.: 12/667,540

(22) PCT Filed: Jul. 7, 2008

(86) PCT No.: PCT/IB2008/052715
§ 371 (c)(1),
(2), (4) Date: Jan. 4, 2010

(87) PCT Pub. No.: WO2009/007899
PCT Pub. Date: Jan. 15, 2009

(65) Prior Publication Data
US 2010/0176385 A1    Jul. 15, 2010

(30) Foreign Application Priority Data
Jul. 11, 2007 (EP) .................... 07112236

(51) Int. Cl.
*H01L 29/08* (2006.01)
*H01L 51/00* (2006.01)

(52) U.S. Cl.
USPC ..................... 257/40; 257/E51.004

(58) Field of Classification Search
USPC ............................ 257/40, E51.004
See application file for complete search history.

(56) References Cited

U.S. PATENT DOCUMENTS

| 5,399,936 | A | | 3/1995 | Namiki et al. |
| 5,804,917 | A | * | 9/1998 | Takahashi et al. ............ 313/504 |
| 5,859,397 | A | * | 1/1999 | Ichinose et al. .......... 204/157.15 |
| 6,320,312 | B1 | * | 11/2001 | Kim et al. ...................... 313/506 |
| 6,995,035 | B2 | * | 2/2006 | Cok et al. ......................... 438/82 |
| 7,011,983 | B2 | | 3/2006 | Foust et al. |
| 7,504,655 | B2 | * | 3/2009 | Parker et al. ..................... 257/40 |
| 2003/0098946 | A1 | * | 5/2003 | Blaessing et al. ............. 349/187 |
| 2003/0146436 | A1 | * | 8/2003 | Parker et al. ..................... 257/72 |
| 2003/0164679 | A1 | * | 9/2003 | Hamano et al. ............... 313/504 |
| 2004/0251045 | A1 | * | 12/2004 | Wu et al. ........................ 174/250 |
| 2005/0012465 | A1 | | 1/2005 | Uchida |
| 2005/0077814 | A1 | | 4/2005 | Koo et al. |
| 2005/0088079 | A1 | * | 4/2005 | Daniels ......................... 313/504 |
| 2006/0267479 | A1 | * | 11/2006 | Chi ............................... 313/495 |
| 2007/0159086 | A1 | * | 7/2007 | Yu et al. ........................ 313/506 |
| 2008/0204366 | A1 | * | 8/2008 | Kane et al. ...................... 345/44 |

FOREIGN PATENT DOCUMENTS

| EP | 1895592 A1 | 3/2008 |
| KR | 100722118 B1 | 5/2007 |
| WO | 2004019666 A1 | 3/2004 |
| WO | 2005053053 A1 | 6/2005 |
| WO | 2006064443 A2 | 6/2006 |
| WO | 2007004115 A2 | 1/2007 |

\* cited by examiner

*Primary Examiner* — William D Coleman
*Assistant Examiner* — Igwe U Anya
(74) *Attorney, Agent, or Firm* — Yuliya Mathis; Mark Beloborodov

(57) ABSTRACT

An organic functional device (1; 40; 50) comprising a substrate (2) having a first electrode layer (3) and at least a first substrate shunt structure (6), at least a first organic functional layer (7) provided on top of the first electrode layer (3), a second, transparent electrode layer (8) arranged on top of the first organic functional layer (7). The organic functional device further comprises a plurality of mutually spaced apart second electrode shunting structures (9a-d) which are each in electrical contact with the second electrode layer (8) and with the first substrate shunt structure (6).

20 Claims, 5 Drawing Sheets

ORGANIC FUNCTIONAL DEVICE AND MANUFACTURING METHOD THEREFOR

TECHNICAL FIELD OF THE INVENTION

The present invention relates to an organic functional device, such as an organic light-emitting diode (OLED), and a method for manufacturing such an organic functional device.

TECHNICAL BACKGROUND

Common for all organic functional devices, such as organic light emitting diodes (OLEDs), organic solar cells, organic photovoltaic elements, organic photo diodes, organic photosensors etc., is that an organic functional layer is sandwiched between and interacts with a pair of electrode layers. In an OLED, the application of a voltage between the electrode layers results in emission of light by the organic functional layer and in an organic solar cell, absorption of light by the organic functional layer leads to the creation of a voltage between the electrode layers.

For organic functional devices that interact with light, including organic LEDs, organic solar cells etc, at least one of the electrode layers is generally transparent. Transparent electrode layers typically have a relatively large surface resistance (for an ITO (indium tin oxide) layer, the surface resistance is typically about 10-15$\Omega$/). Due to this high surface resistance, the voltage between the electrode layers sandwiching the organic functional layer becomes dependent on lateral position across the device. This position dependent voltage leads to a non-uniform distribution of the current flowing through the organic functional layer in the device. For an OLED, this leads to a non-uniform light output of the OLED.

In order to improve the uniformity of the current distribution in an organic functional device, highly conductive shunting structures are often provided to distribute an electrode layer voltage over an electrode layer having a high surface resistance.

However, materials having a sufficiently high conductivity for use in shunting structures are opaque and can therefore not be deposited on too large coherent portions of the electrode layer.

A standard method to solve that is to make use of a metal grid. For transparent electrodes fabricated before the organic functional layer is provided, this is normally rather straightforward, since various dry and wet deposition techniques, such as photolithography, as well as a high deposition temperatures can be used, whereby complex patterns can be formed, and a wide variety of materials are available for deposition.

Following provision of the organic functional layer, however, the number of suitable deposition techniques is severely limited, since the organic functional layer is sensitive to high temperatures etc. A possible method for applying shunting structures without damaging the organic functional layer is to use a shadow mask and evaporate a highly conductive substance, such as a metal or carbon through openings in the mask. Due to the inherent design constraints of a shadow mask, the shunting structures deposited through this method are, however, limited to isolated, rather simple structures, such as substantially parallel lines.

Through the provision of such structures, the uniformity of the current distribution in the organic functional device is improved, especially in the general direction of extension of the shunting structures. In portions of the organic functional device between such isolated structures there are typically, however, still variations in the voltage across the organic functional layer, and accompanying non-uniformity in the current distribution.

SUMMARY OF THE INVENTION

In view of the above-mentioned and other drawbacks of the prior art, a general object of the present invention is to provide an improved organic functional device, especially having an improved uniformity of the distribution of the current flowing through the organic functional layer, when the organic functional device is in use.

According to a first aspect of the present invention, these and other objects are achieved through an organic functional device comprising: a substrate having a first electrode layer and at least a first electrically conductive substrate shunt structure; at least a first organic functional layer provided on top of the first electrode layer; a second, transparent electrode layer arranged on top of the first organic functional layer; and a plurality of mutually spaced apart second electrode shunting structures each being in electrical contact with the second electrode layer and with the first substrate shunt structure.

Examples of organic functional devices include organic light-emitting diodes (OLEDs), organic photocells, organic photovoltaic elements, organic photodiodes and organic photosensors.

By the term "electrode layer" should be understood an electrically conductive layer which could be transparent or non-transparent to light.

In applications where light should be received and/or emitted by the organic functional layer, the substrate and the first electrode layer and/or the second electrode layer should be optically transparent, that is, permit passage of light.

In this case, the substrate may be made of glass or a transparent polymer, and the first and/or second electrode layer(s) may, for example, be manufactured of any material, which is inherently conductive and transparent or, alternatively, of a sufficiently thin metal layer, which could be provided in combination with a transparent conductive or non-conductive layer.

The "organic functional layer" may consist of many different organic layers with different functions (such as hole injection, hole transport, hole blocking, excitation blocking, electron blocking, electron transport, electron injection or light emission, light absorption layers), or mixtures thereof, but may also include metal-organic materials like triplet emitters or inorganic materials such as dielectric, semi-conducting or metallic quantum dots or nano-particles.

The "shunting structures" are electrically conductive structures for making the voltage distribution across the respective electrode layer more uniform when operating the organic functional device. The shunting structures should have a high electrical conductivity as compared to the first electrode layer.

Such shunting structures, or "shunts", are typically employed for large area devices and/or for a transparent electrode layer. Transparent conductive layers generally have such a low conductance that the voltage across the organic functional layer (between the first and second electrode layers) becomes position-dependent in the absence of shunting structures.

The present invention is based upon the realization that the current distribution uniformity in the organic functional device can be improved by forming a conductive structure before the organic functional layer is provided, and using this pre-formed conductive structure for interconnecting the shunting structures that are subsequently deposited following the provision of the organic functional layer. In other words, the second electrode shunting structures are shunted by a previously provided substrate shunt structure.

In this way, a method for depositing the second electrode shunting structures, which is adapted not to damage the sensitive organic functional layer can be used, while at the same time achieving a current distribution uniformity in the organic functional device, which is almost comparable with what would be obtainable without the deposition process restrictions imposed by the organic functional layer.

In order to ensure a sufficiently good electrical connection between the second electrode shunting structures and the first substrate shunt structure, there should be no sudden height differences across the portion of the device where the second electrode structures are deposited. A sufficiently smooth foundation for the deposition of the second electrode shunting structures is, for example, achieved by limiting the step height so that there are no abrupt height differences. A suitable step height limit may be around 100 nm.

The first substrate shunt structure may advantageously be electrically isolated from the first electrode layer. This can be achieved by providing the substrate shunt structure and the first electrode layer laterally separated from each other on the substrate or by forming the first substrate shunt structure on top of the first electrode layer with an insulating layer provided therebetween.

By providing the first substrate shunt structure in such a way that it can be connected to each second electrode shunt structure on at least two separated location, such as at ends thereof, the current distribution uniformity can be further improved, since the substrate shunt structure can generally be formed from a material having a higher conductivity than the second electrode shunt structures.

In transparent applications, such as transparent OLEDs or stacked solar cells, the substrate and the first electrode layer may be transparent, in addition to the second electrode layer. In this case, the first electrode layer may typically be connected to first electrode shunting structures. However, such first electrode shunting structures, which are provided before the organic functional layer can be deposited with deposition techniques allowing virtually any pattern to be formed, without the restrictions imposed by the sensitivity of the organic functional layer.

According to one embodiment of the present invention, the organic functional device may further comprise a second substrate shunt structure formed on the substrate; a second organic functional layer arranged on top of the second electrode layer; a third transparent electrode layer arranged on top of the second organic functional layer; and a plurality of mutually spaced apart third electrode shunting structures each being in electrical contact with the third electrode layer, wherein each of the mutually spaced apart third electrode shunting structures is in electrical contact with the second substrate shunt structure.

According to this embodiment, a stacked organic functional device in which each transparent electrode layer is shunted by a continuous conductive grid structure, is accomplished. The voltage across each organic functional layer in such a stacked organic functional device may advantageously be individually controllable.

The various substrate shunt structures included in this kind of organic functional device should preferably be electrically isolated from each other.

One example of such a stacked organic functional device is an OLED having a plurality of individually controllable electroluminescent layers that emit light of different colors when current is passed therethrough. This technology can, for example, be used for realizing a color controllable light output device, such as a color controllable backlight for a display device, or a color controllable ambiance creating device.

Another example is a stacked solar cell, in which the different organic functional layers in the stack are sensitive to different wavelength ranges in the incoming solar radiation.

According to another embodiment of the present invention, a patterned, electrically insulating layer may be provided between a functional organic layer and an adjacent electrode layer. Through this electrically insulating layer, current flow through the organic functional layer can be prevented at selected locations, whereby a predetermined pattern, such as a symbol or text can be presented to a user.

In a stacked structure organic functional device, such insulating layers can be provided between several organic functional layers and at least one of their respective adjacent electrode layers. Hereby, for example, variable signage can be achieved, where different predefined patterns can be controllably displayed, optionally using differently colored light.

Furthermore, organic functional devices are typically formed on a substrate and subsequently encapsulated by means of a lid to prevent ambient substances, such as water and oxygen, from reaching the functional layers (the electrode layers and the organic functional layer) of the device.

The lid may be arranged in such a way that there is a space or gap between the functional layers and the lid. This space may, for example, be filled with an inert gas, such as nitrogen.

According to a second aspect of the present invention, the above-mentioned and other objects are achieved through a method for manufacturing an organic functional device, comprising the steps of: providing a substrate having a first electrode layer and an electrically conductive substrate shunt structure; providing an organic functional layer on top of the first electrode layer; forming a second, transparent electrode layer on top of the organic functional layer; arranging a plurality of mutually spaced apart shunting structures in such a way that each of the shunting structures is electrically connected with the substrate shunt structure, wherein each of the mutually spaced apart shunting structures is in electrical contact with the second electrode layer.

In order to ensure that the organic functional layer is not damaged, the step of arranging the shunting structures may advantageously comprise the steps of positioning a shadow mask in front of the substrate; and depositing a conductive material through openings provided in the shadow mask.

The conductive material, which may, for example, contain carbon and/or a metal or metals, may be deposited through, for example, evaporation or sputtering.

Furthermore, the shunting structures may be provided either before or after the deposition of the second electrode layer, so that the shunting structures are either arranged between the organic functional layer and the second electrode layer, or on top of the second electrical layer.

Further features and advantages of this second aspect of the present invention are largely analogous to those described above in connection with the first aspect of the invention.

BRIEF DESCRIPTION OF THE DRAWINGS

These and other aspects of the present invention will now be described in more detail, with reference to the appended drawings showing currently preferred embodiments of the invention, wherein:

FIG. 3b is a section view of the organic functional device in FIG. 3a taken along the line I-I in FIG. 3a;

DETAILED DESCRIPTION OF PREFERRED EMBODIMENTS OF THE INVENTION

In the following description, the present invention is described with reference to an OLED-based light emitting panel. It should be noted that this by no means limits the scope of the invention, which is equally applicable to many other organic functional devices, such as organic solar cells or organic photodiodes.

Figure 1:
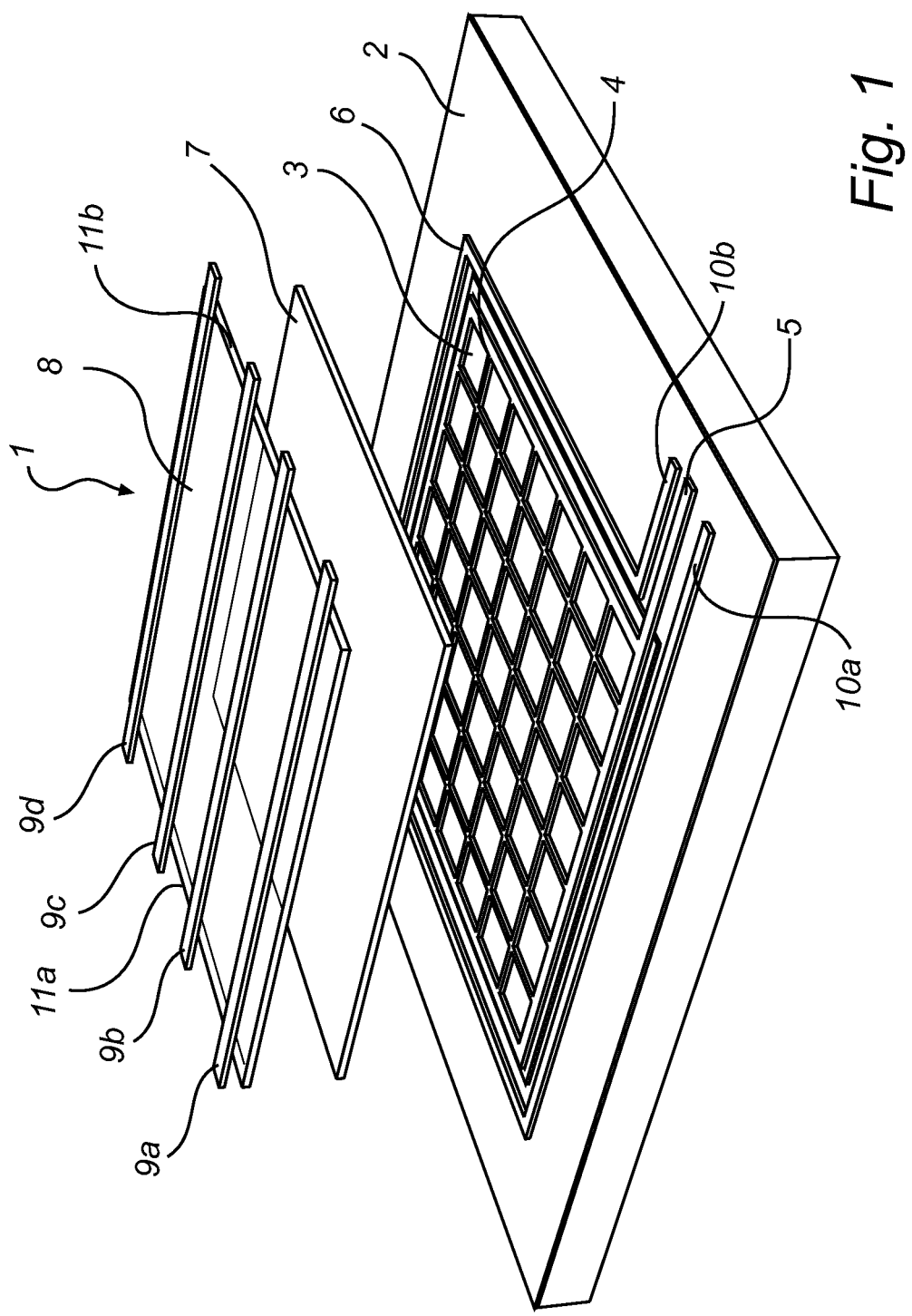
FIG. 1 is an exploded perspective view schematically illustrating a first embodiment of an organic functional device according to the present invention.

FIG. 1 schematically illustrates an organic functional device according to a first embodiment of the present invention, in the form of a transparent OLED-based light emitting panel 1.

With reference to FIG. 1, the light emitting panel 1 comprises a substrate 2, on which a first transparent electrode layer 3 is formed. Since a transparent electrode layer, such as the first electrode layer 3 in FIG. 1 is typically too resistive to ensure that substantially the same voltage is present over the entire area of the transparent electrode layer 3, the organic functional device 1 in FIG. 1 includes first electrode shunting structures 4, which are here provided in the form of a square grid. The first electrode shunting structures 4 serve to shunt the first electrode layer 3 and have a connection conductor 5 for enabling connection of the first electrode shunting structures to the first electrode layer voltage.

Outside the area occupied by the first electrode layer 3, a first substrate shunt structure 6 is formed on the substrate 2. This first substrate shunt structure forms a loop around the first electrode layer 3 to two connection conductors 10a-b for enabling connection of the first substrate shunt structure 6 to a desired voltage.

The first electrode shunting structures 4 are provided with an insulating layer (not shown in FIG. 1), and the first substrate shunt structure 6 is left unisolated.

On top of the first electrode layer 3 (and the insulated first electrode shunting structures 6), an organic functional layer 7, is provided.

On top of the organic functional layer 7, a second transparent electrode layer 8 is provided, and on top of this second electrode layer, second electrode shunting structures 9a-d are formed.

These second electrode shunting structures 9a-d extend past the edges 11a-b of the second electrode layer 8 to come into electrical contact with the first substrate shunt structure 6 on the substrate 2.

Hereby, the second electrode shunting structures 9a-d and the first substrate shunt structure 6 together form a continuous conductive grid, which effectively shunts the second electrode layer 8, thereby improving the uniformity of the current distribution in the organic functional device 1.

Figure 2:
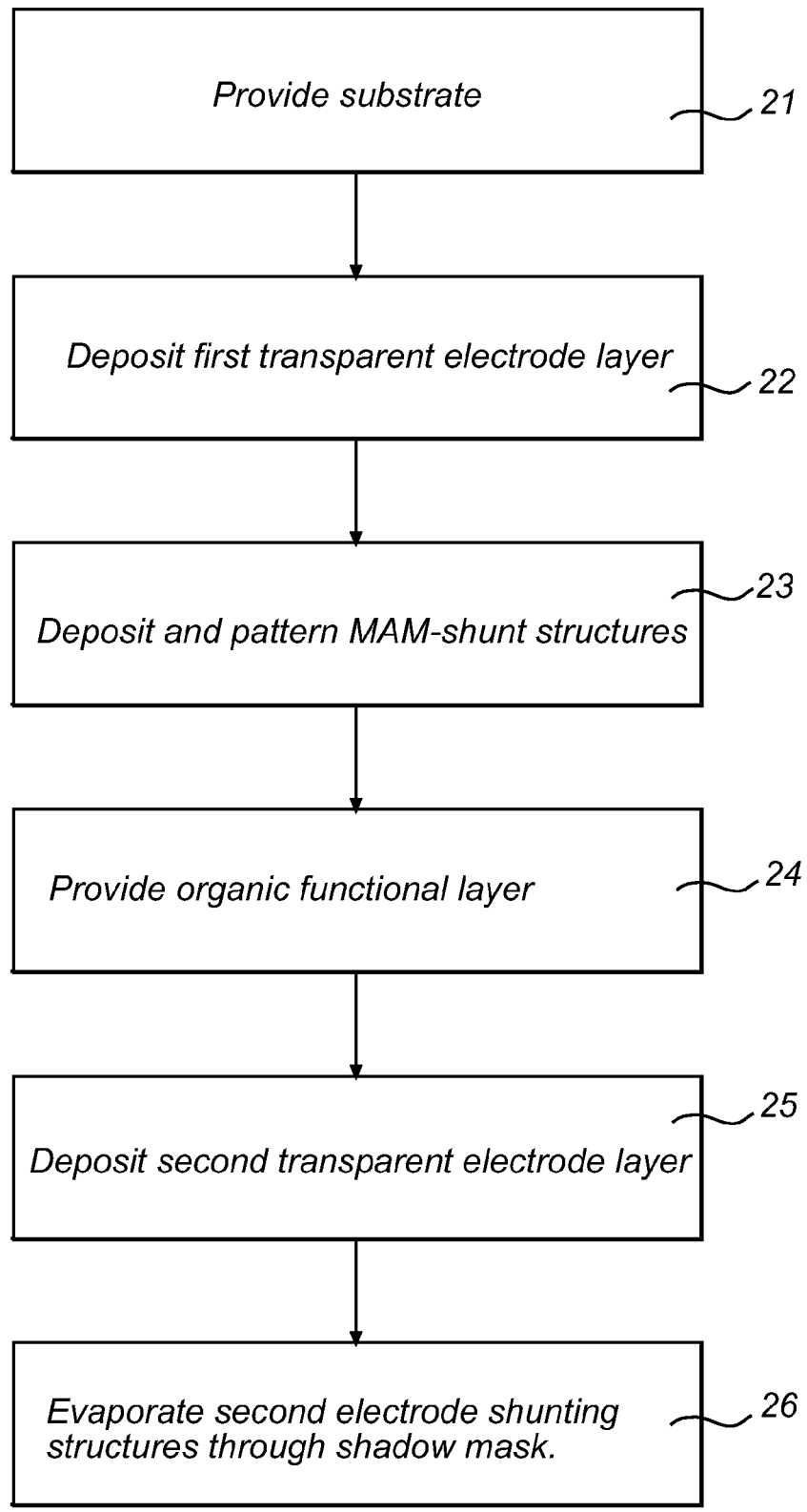
FIG. 2 is a flow chart schematically illustrating a method for manufacturing the organic functional device in FIG. 1.

A method for manufacturing the organic functional device 1 in FIG. 1, will now be described with reference to the flow-chart in FIG. 2 and to the exploded section view in FIG. 1.

In a first step 21, the substrate 2 is provided. The substrate 2 can be substantially rigid or flexible, and may for example be made of glass or a suitable plastic material.

Subsequently, the first transparent electrode layer 3 is deposited in step 22. The first transparent electrode layer 3 may typically be made of Indium Tin Oxide (ITO), Indium Zinc Oxide (IZO) or the like or by a thin metal layer formed on a transparent substrate. Such a metal layer should be sufficiently thin to be transparent, i.e. in the range of 5-20 nm.

In the next step 23, a Molybdenum-Aluminum-Molybdenum (MAM)-layer is deposited and patterned using photolithography to form the first electrode shunting structures 4 and the first substrate shunt structure 6.

Thereafter, in step 24, the organic functional layer 7 is provided on top of the first electrode layer 3 and the first electrode shunting structures 4. The organic functional layer 7 may generally comprise several organic layers. In case the organic functional device 1 is a polymer light-emitting diode (LED), the organic functional layer 7 essentially comprises a two layer stack of a hole conductor layer and a light emitting polymer layer and may further include several additional layers such as an evaporated organic hole blocking layer on the light emitting polymer.

In case the organic functional device 1 is a small molecule OLED, the organic functional layer 7 is generally formed as a more complex stack including a hole injection layer, a hole transport layer, an electron blocking layer, a light-emitting layer, a hole blocking layer and an electron transporting layer, as well as an electron blocking layer or the like. After the provision of the organic functional layer 7, the second transparent electrode 8 is deposited in step 25.

The second electrode layer 8 is deposited using a dry process, and typically contains an injection layer, such as Barium (Ba), Calcium (Ca), Lithium Fluoride (LiF) or the like, Aluminum (Al), Silver (Ag), or stacked layers of different ones of these materials and other optically transmissive enhancement layers such as Zinc Selenide (ZnSe) (which is highly transparent) or the like.

Finally, in step 26, second electrode shunting structures 9a-d are evaporated on the second electrode layer 8 through a shadow mask. By depositing the second electrode shunting structures 9a-d through a shadow mask, damage to the relatively sensitive organic functional layer 7 can be avoided. However, shadow mask deposition is generally limited to relatively simple, physically separated structures, such as the exemplary parallel lines 9a-d shown in FIG. 1. Such separated structures 9a-d alone will provide some degree of shunting. However, in order to improve the shunting of the second electrode layer 8, the second electrode shunting structures 9a-d are, according to the present invention, arranged in such a way that each of the shunting structures 9a-d is in electrical contact with the first substrate shunt structure 6 previously formed on the substrate 2.

Figure 3A:
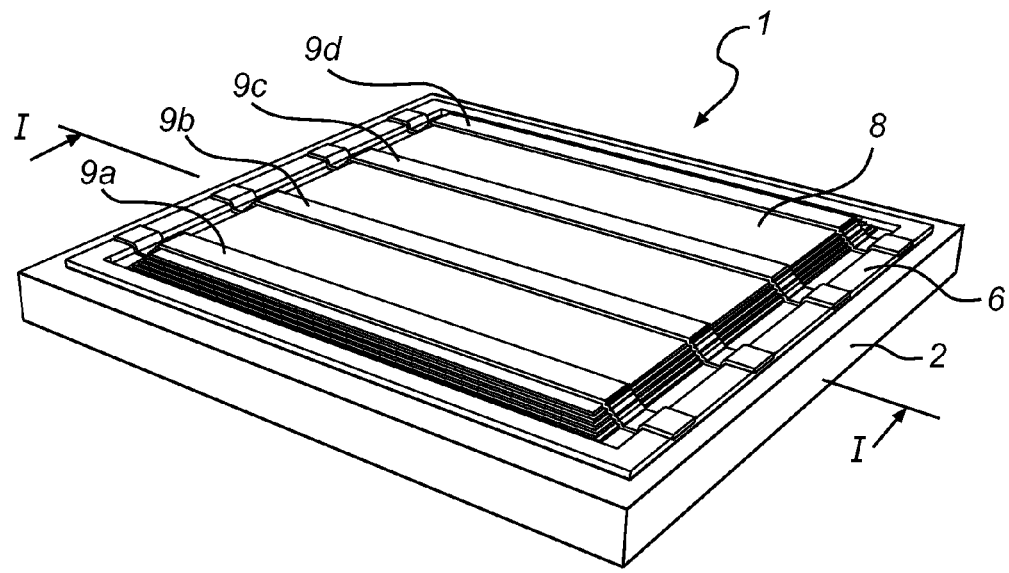
FIG. 3a is a perspective view of the organic functional device in FIG. 1.
Figure 3B:
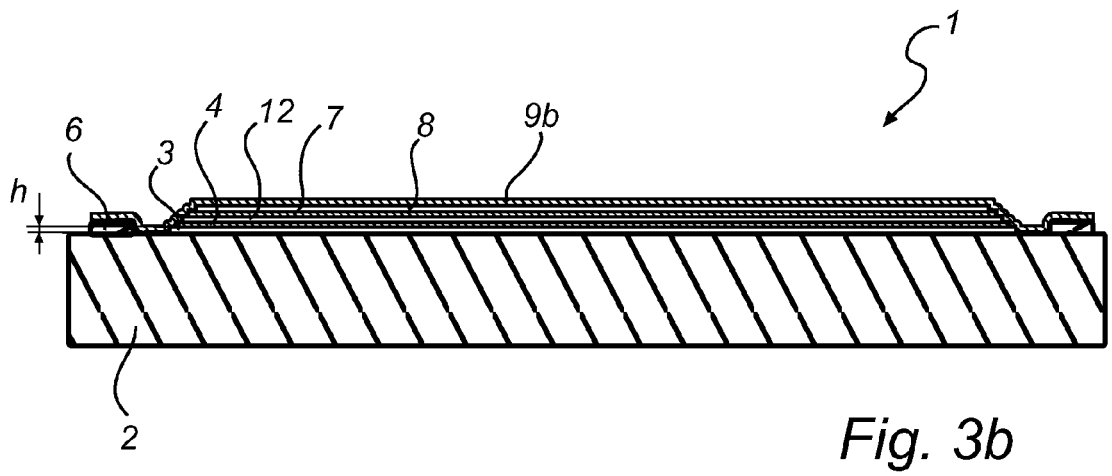

Turning now to FIGS. 3a-b, the arrangement of the second electrode shunting structures 9a-d will be explained in more detail.

With reference to FIG. 3a, which is a perspective view of the organic functional device 1 in FIG. 1, it can be seen how the second electrode shunting structures 9a-d smoothly follow the transition from on top of the second electrode layer 8, down to the surface of the substrate 2, and up to and covering the first substrate shunt structure 6.

The design considerations for achieving such a smooth and unbroken connection between the second electrode layer 8 and the first substrate shunt structure 6 will be further elucidated with reference to FIG. 3b, which is a schematic cross-section view of the organic functional device in FIG. 3a along the line I-I.

As is schematically shown in FIG. 3b, the different layers formed on the substrate 2—the first electrode layer 3, the first electrode shunting structures 4, an insulating layer 12 formed on top of the first electrode shunting structures 4, the organic functional layer 7, and the second electrode layer 8—are each formed to have a slightly smaller extension, so that the step height h is sufficiently small, for example <100 nm to ensure that the second electrode shunting structures 9a-d are not interrupted when traversing the height difference from the substrate 2 to the top of the second electrode layer 8.

Since the main aim of FIGS. 3a-b is to clearly show the connection between the second electrode shunting structures 9a-d and the second electrode 8 and the first substrate shunting structure 6, respectively, the first substrate shunting structure 6 has been simplified to a rectangular outline, and the terminal (5 in FIG. 1) for connection of the first electrode shunting structures 4 has been omitted.

Figure 4:
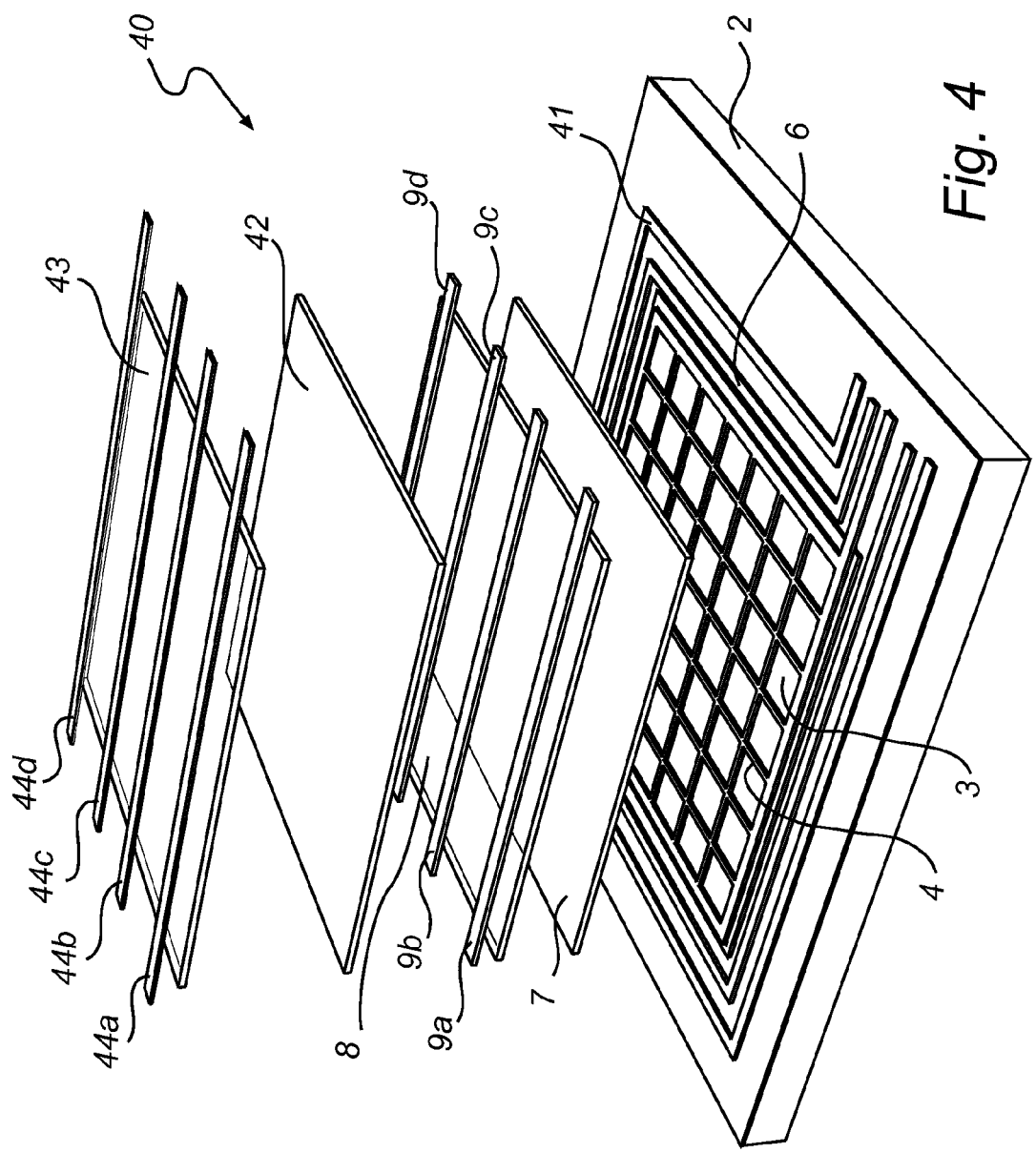
FIG. 4 is an exploded perspective view schematically illustrating a second embodiment of an organic functional device according to the present invention.

With reference to FIG. 4, a second embodiment of the organic functional device according to the present invention will now be described.

Additionally to the structures and layers described in connection with the organic functional device 1 described above with reference to FIG. 1, the organic functional device 40 in FIG. 4 is provided with a second shunt structure 41 formed on the substrate 2, a further, second organic functional layer 42 provided on top of the second electrode layer 8, and a third electrode layer 43 provided on top of the second organic functional layer 42. The organic functional device 40 in FIG. 4 further has third electrode shunting structures 44a-d formed on top of the third electrode layer 43. In analogy to the second electrode shunting structures 9a-d, these third electrode shunting structures are arranged to be electrically connected to the third electrode layer 43 as well as to the second substrate shunt structure 41.

The organic functional device 40 shown in FIG. 4 may, for example be a variable color OLED-based light emitting panel in which the first organic functional layer 7 is an electroluminescent layer (EL-layer) configured to emit light having a first wavelength distribution (color), and the second organic functional layer 42 is an EL-layer configured to emit light having a second wavelength distribution (color).

Alternatively, the organic functional device 40 may be a stacked solar cell comprising first and second photovoltaic layers 7, 42, that are sensitive to light of different wavelength regions.

Finally, with reference to FIG. 5, a third embodiment of the organic functional device according to the present invention will now be described.

Figure 5:
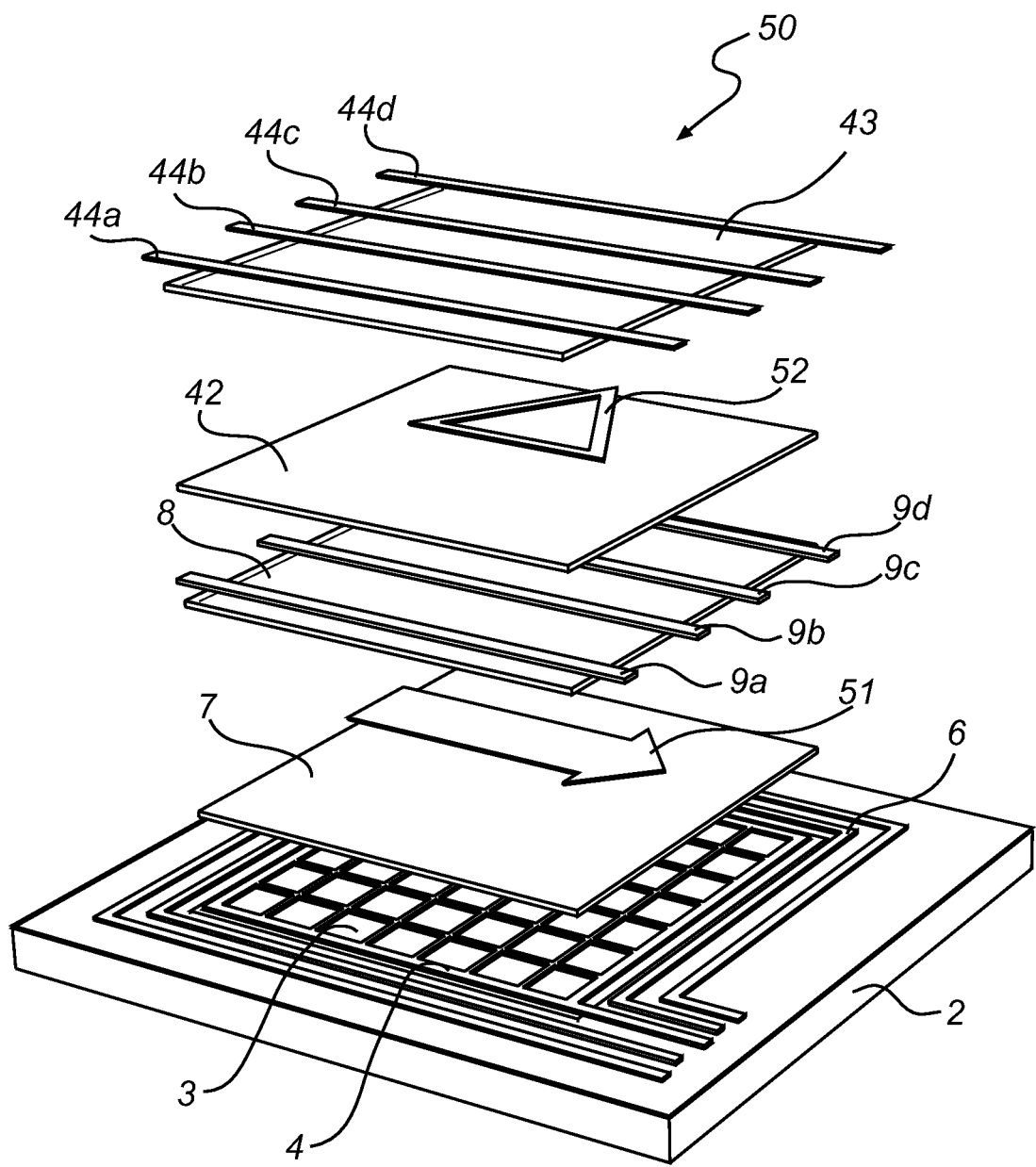
FIG. 5 is an exploded perspective view schematically illustrating a third embodiment of an organic functional device according to the present invention.

As shown in FIG. 5, the organic functional device 50 illustrated therein differs from the organic functional device 40 shown in FIG. 4 in that first 51 and second 52 patterned insulating layers are interposed between the first organic functional layer 7 and the second electrode layer 8, and between the second organic functional layer 42 and the third electrode layer, respectively.

Through the provision of these patterned insulating layers 51, 52, the flow of current through the respective electroluminescent layers 7, 42 can be locally prevented, and thereby the emission of light from the respective layers 7, 42 also prevented. Hereby, the light-emitting panel 50 can be made to display, and switch between, pre-determined display images, in which the features may be differently colored.

Common for all the drawings referred to is that they are not drawn to scale. Typically, the thickness dimension has been exaggerated for clarity of drawing.

The person skilled in the art realizes that the present invention by no means is limited to the preferred embodiments. For example, the organic functional device may include a larger number of shunting structures, and the shunting structures may be provided in other layouts.

The invention claimed is:

1. An organic functional device, comprising:
   a substrate having a first electrode layer and at least a first pre-formed substrate shunt structure;
   at least a first organic functional layer provided on top of said first electrode layer;
   second, transparent electrode layer arranged on top of said first organic functional layer; and
   a plurality of mutually spaced apart second electrode shunting structures each being in electrical contact with said second electrode layer and being arranged on top of and in electrical contact with said first pre-formed substrate shunt structure,
   wherein said first substrate shunt structure is electrically connected to each of said second electrode shunting structures at two spaced apart locations along said second electrode shunting structure.

2. The organic functional device of claim 1, wherein each of said first substrate shunt structure and said first electrode layer is formed on a first side of said substrate, and said first substrate shunt structure and said first electrode layer are electrically isolated from each other.

3. The organic functional device of claim 1, wherein said two spaced apart locations along said second electrode shunting structure are disposed at opposite ends of the second electrode shunting structure.

4. The organic functional device of claim 1, wherein each of said substrate and said first electrode layer is optically transparent.

5. The organic functional device of claim 1, further comprising
   a second substrate shunt structure formed on said substrate;
   a second organic functional layer arranged on top of said second electrode layer;
   a third transparent electrode layer arranged on top of said second organic functional layer; and
   a plurality of mutually spaced apart third electrode shunting structures each being in electrical contact with said third electrode layer,
   wherein each of said mutually spaced apart third electrode shunting structures is in electrical contact with said second substrate shunt structure.

6. The organic functional device of claim 5, wherein said second substrate shunt structure is provided on said first side of the substrate and is electrically isolated from said first substrate shunt structure and said first electrode layer.

7. The organic functional device of claim 1, further comprising a patterned, electrically insulating layer provided between said first organic functional layer and at least one of said first and second electrode layers.

8. The organic functional device of claim 1, wherein said organic functional layer comprises an electroluminescent layer.

9. The organic functional device of claim 1, wherein said organic functional layer comprises a photovoltaic layer.

10. The organic functional device of claim 1, further comprising a first electrode shunting structure disposed between the substrate and the first organic functional layer.

11. The organic functional device of claim 10, wherein the first electrode shunting structure comprises a grid.

12. The organic functional device of claim 1, wherein the first electrode shunting structure comprises a Molybdenum-Aluminum-Molybdenum layer.

13. The organic functional device of claim 1, wherein the first pre-formed substrate shunt structure comprises a Molybdenum-Aluminum-Molybdenum layer.

14. The organic functional device of claim 1, wherein the second, transparent electrode layer comprises a single continuous structure substantially covering the first organic functional layer.

15. The organic functional device of claim 1, wherein the plurality of mutually spaced apart second electrode shunting structures are each disposed on top of and extending across the second, transparent electrode layer.

16. The organic functional device of claim 1, wherein the plurality of mutually spaced apart second electrode shunting structures define a plurality of openings exposing portions of the second, transparent electrode layer.

17. The organic functional device of claim 1, wherein the first pre-formed substrate shunt structure comprises a loop disposed around the first electrode layer, and wherein each of said second electrode shunting structures directly contacts the first pre-formed substrate shunt structure at two spaced apart and separated locations on the loop.

18. A method for manufacturing an organic functional device, comprising:
providing a substrate having a first electrode layer and a pre-formed substrate shunt structure;
providing an organic functional layer on top of said first electrode layer;
forming a second, transparent electrode layer on top of said organic functional layer;
arranging a plurality of mutually spaced apart shunting structures on top of said pre-formed substrate shunt structure in such a way that each of said shunting structures is electrically connected with said substrate shunt structure at two spaced apart locations along said shunting structure,
wherein each of said mutually spaced apart shunting structures is in electrical contact with said second electrode layer.

19. The method of claim 18, wherein said step of arranging said shunting structures comprises:
positioning a shadow mask in front of said substrate; and
depositing a conductive material through openings provided in said shadow mask.

20. An organic functional device, comprising:
a substrate having a first electrode layer and at least a first pre-formed substrate shunt structure;
at least a first organic functional layer provided on top of said first electrode layer;
second, transparent electrode layer arranged on top of said first organic functional layer; and
a plurality of mutually spaced apart second electrode shunting structures each being in electrical contact with said second electrode layer and being arranged on top of and in electrical contact with said first pre-formed substrate shunt structure,
wherein the first pre-formed substrate shunt structure comprises a loop disposed around the first electrode layer, and
wherein the mutually spaced apart second electrode shunting structures each comprise a linear structure extending across the first electrode layer and connecting to the first pre-formed substrate shunt structure at opposite sides of the first electrode layer.

* * * * *